United States Patent
Wang et al.

(10) Patent No.: US 10,042,008 B2
(45) Date of Patent: Aug. 7, 2018

(54) TIME BASED AC LINE DETECTION

(71) Applicant: Dialog Semiconductor Inc., Campbell, CA (US)

(72) Inventors: Xiaoyan Wang, Milpitas, CA (US); Nan Shi, Newark, CA (US); Clarita C. Knoll, Pleasanton, CA (US)

(73) Assignee: Dialog Semiconductor Inc., Campbell, CA (US)

( * ) Notice: Subject to any disclaimer, the term of this patent is extended or adjusted under 35 U.S.C. 154(b) by 293 days.

(21) Appl. No.: 14/486,782

(22) Filed: Sep. 15, 2014

(65) Prior Publication Data

US 2016/0077165 A1    Mar. 17, 2016

(51) Int. Cl.
*G01R 31/42* (2006.01)
*G01R 19/04* (2006.01)

(52) U.S. Cl.
CPC ............. *G01R 31/42* (2013.01); *G01R 19/04* (2013.01)

(58) Field of Classification Search
None
See application file for complete search history.

(56) References Cited

U.S. PATENT DOCUMENTS

| | | | |
|---|---|---|---|
| 6,407,515 B1 * | 6/2002 | Hesler | H02M 5/293 315/224 |
| 8,018,172 B2 * | 9/2011 | Leshniak | H05B 33/0815 315/194 |
| 2008/0204954 A1 * | 8/2008 | Bickel | H02H 3/247 324/102 |
| 2011/0080104 A1 * | 4/2011 | Gray | H05B 41/40 315/246 |

(Continued)

FOREIGN PATENT DOCUMENTS

| | | |
|---|---|---|
| CN | 1910809 A | 2/2007 |
| CN | 101799487 A | 8/2010 |
| CN | 102005876 A | 4/2011 |

(Continued)

OTHER PUBLICATIONS

Chinese Office Action, Chinese Utility Model Application No. 201520382178.7, dated Jul. 31, 2015, 6 pages.

(Continued)

*Primary Examiner* — Melissa Koval
*Assistant Examiner* — Felicia Farrow
(74) *Attorney, Agent, or Firm* — Fenwick & West LLP (57) ABSTRACT

A power supply detection system and method for determining the AC mains voltage range when a device (e.g., LED based bulbs) is indirectly connected to the AC mains and the device does not receive the complete sinusoidal AC mains signal. The power supply detection system and method receive an input signal having a first portion that is a sinusoidal signal that generally corresponds to a first portion of the voltage source signal and a second portion that is not a sinusoidal signal that generally corresponds to a second portion of the voltage source signal. A selected reference signal is received, wherein the selected reference signal is synchronized with the input signal. The first portion of the input signal is compared with a corresponding portion of the selected reference signal, and the voltage range of the voltage source is determined based on the comparison.

20 Claims, 5 Drawing Sheets

(56) References Cited

U.S. PATENT DOCUMENTS

2012/0139438 A1* 6/2012 Soleno ............... H05B 33/0815
315/291
2012/0319605 A1* 12/2012 Choi .................. H05B 33/0815
315/201

FOREIGN PATENT DOCUMENTS

| CN | 102573218 A | 7/2012 |
| CN | 204945344 U | 1/2016 |

OTHER PUBLICATIONS

Chinese First Office Action, Chinese Application No. 201510303018.3, dated May 24, 2018, 17 pages.

* cited by examiner

TIME BASED AC LINE DETECTION

BACKGROUND OF THE DISCLOSURE

1. Field of the Invention

This disclosure relates to determining an voltage of an AC main at a device that does not directly receive the AC mains voltage mains signal and does not receive the complete sinusoidal AC mains signal.

2. Description of the Related Art

Switching power supplies are used to provide efficient, regulated power to electronic devices. Power supplies that are coupled to the alternating current (AC) mains are commonly referred to as "offline power supplies." Worldwide, there are two predominate AC mains operating ranges; (a) 120 AC voltage (VAC) has a range of approximately 85 VAC to 135 VAC (referred to herein when describing some embodiments as the LOW-range), and (b) 220 VAC has a range of approximately 170 VAC to 270 VAC (referred to herein when describing some embodiments as the HIGH-range). Universal power supplies, commonly referred to offline power supplies, can be connected to either AC mains voltage ranges, allowing electronic device manufacturers the convenience of designing a single product suitable for worldwide distribution. Many universal power supplies detect the AC mains operating range, e.g., LOW-range or HIGH range, in order to make operational adjustments such as modulation parameters, protection thresholds, over-voltage protection (OVP) and under-voltage protection (UVP), for example.

In conventional environments, there is a direct connection of the offline power supply to the AC mains, the voltage range can be determined simply using peak detection or V-RMS sensing. However, in the case of devices such as LED-based bulbs, the bulb may be either coupled directly to the AC mains, or indirectly through a phase cut dimmer switch. In the case where it is an indirect connection via a phase cut dimmer switch, the AC mains voltage range cannot be determined using peak detection or V-RMS sensing. Therefore, prior art bulbs are unable to optimize control and other operations due to the inability to determine the AC mains operating range.

SUMMARY

Embodiments provide a power supply detection system and method for determining the AC mains voltage range when a device (e.g., LED based bulbs) is indirectly connected to the AC mains and the device does not receive the complete sinusoidal AC mains signal.

In one example, a phase-cut dimmer switch is coupled between the device and the AC mains, where the phase-cut dimmer switch blocks the AC mains signal so that only a portion of the signal passes through. Embodiments identify one or more reference signals, ensure the reference signal and the output of the phase-cut dimmer switch are time synchronized, i.e., have identical frequency and phase, and perform one or more comparisons which embodiments use to identify a range within which the AC mains voltage lies. This information can be used to make operational adjustments such as modulation parameters over-voltage protection (OVP), under-voltage protection (UVP), and protection thresholds, for example.

An embodiment includes a method for determining a voltage range of a voltage source, the voltage source generating sinusoidal signals, comprising, receiving an input signal, said input signal having a first portion that is a sinusoidal signal that generally corresponds to a first portion of the voltage source signal, said input signal having a second portion that is not a sinusoidal signal that generally corresponds to a second portion of the voltage source signal, receiving a selected reference signal, wherein said selected reference signal is synchronized with the input signal, comparing said first portion of the input signal with a corresponding portion of the selected reference signal; and determining the voltage range of the voltage source based on said comparison.

BRIEF DESCRIPTION OF THE DRAWINGS

The teachings of the embodiments of the present invention can be readily understood by considering the following detailed description in conjunction with the accompanying drawings.

DETAILED DESCRIPTION OF EMBODIMENTS

The Figures (FIG.) and the following description relate to preferred embodiments by way of illustration only. It should be noted that from the following discussion, alternative embodiments of the structures and methods disclosed herein will be readily recognized as viable alternatives that may be employed without departing from the principles of the claimed invention.

Reference will now be made in detail to several embodiments of the present invention(s), examples of which are illustrated in the accompanying figures. It is noted that wherever practicable similar or like reference numbers may be used in the figures and may indicate similar or like functionality. The figures depict embodiments of the present invention for purposes of illustration only. One skilled in the art will readily recognize from the following description that alternative embodiments of the structures and methods illustrated herein may be employed without departing from the principles of the invention described herein.

As will be explained in more detail below with reference to the figures, the device 106 can be a variety of devices that receive cut-off AC main signals. As described above, and without limiting the embodiments, the device 106 can be a LED lamp system and a method according to various embodiments. The LED lamp system can use dissipative sources to power internal components of the LED lamp. In particular, the LED lamp can charge a capacitor to generate a Vcc voltage that is used for powering various active components of the lamp, such as one or more switch controllers. In order for the device, e.g., LED lamp, to operate effectively, the voltage of the AC mains signal is determined using the system and method described herein.

Embodiments provide a power supply detection system and method for determining the AC mains voltage range when a device 106 (e.g., LED based bulbs) is indirectly connected to a voltage source, in embodiments the voltage source is an AC mains 102 and the device does not receive the complete sinusoidal AC mains signal. In alternate embodiments the device detects the voltage of any voltage source, the AC mains 102 being one possible voltage source.

In one example, a phase-cut dimmer switch 104 is coupled (directly or indirectly) between the device 106 and the AC mains 102, where the phase-cut dimmer switch 104 blocks the AC input voltage signal 115 so that only a portion of the signal passes through as an input to the device 106. Embodiments identify one or more reference signals, ensure the reference signal and the device input voltage signal 135 is in phase and perform one or more comparisons which embodiments use to identify a range within which the AC mains voltage lies. This information can be used to make operational adjustments such as modulation parameters, over-voltage protection (OVP) and under-voltage protection (UVP), and protection thresholds, for example.

Figure 1A:
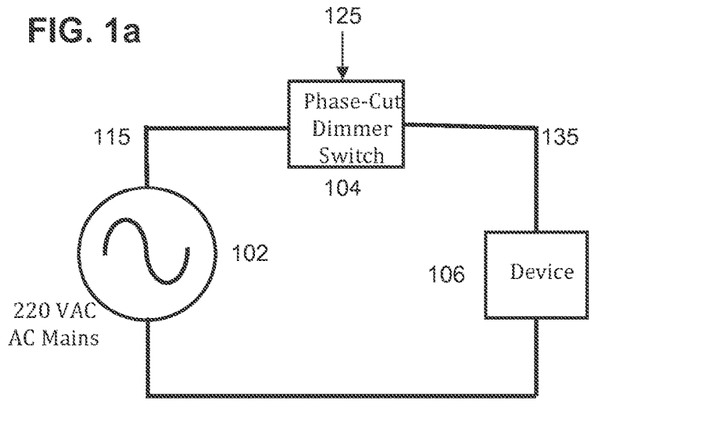
FIG. 1a illustrates a circuit, according to one embodiment.

FIG. 1a illustrates an system, e.g., an LED lamp system, a device 106, e.g., an LED lamp, used with a conventional dimmer switch 104. In the embodiment where the device 106 is an LED lamp, the LED lamp 106 according to various embodiments is a replacement of an incandescent lamp in a conventional dimmer switch setting. A dimmer switch 104 is placed in series with AC input voltage source 102 and LED lamp 106. Dimmer switch 104 receives a dimming input signal 125 and uses the input signal to set the desired light output intensity of LED lamp 106. Dimmer switch 104 receives AC input voltage signal 115 and adjusts the V-RMS value of device input voltage signal 135 in response to dimming input signal. In other words, control of the light intensity outputted by LED lamp 106 by dimmer switch 104 is achieved by adjusting the RMS value of the device input voltage signal 135 that is applied to LED lamp 106. The LED lamp 106 controls the light output intensity of LED lamp 106 to vary proportionally to the lamp input voltage, exhibiting behavior similar to incandescent lamps, even though LEDs are current-driven devices and not voltage-driven devices. The dimming input signal 125 can either be provided manually (via a knob or slider switch, not shown herein) or via an automated lighting control system (not shown herein).

Figure 1B:
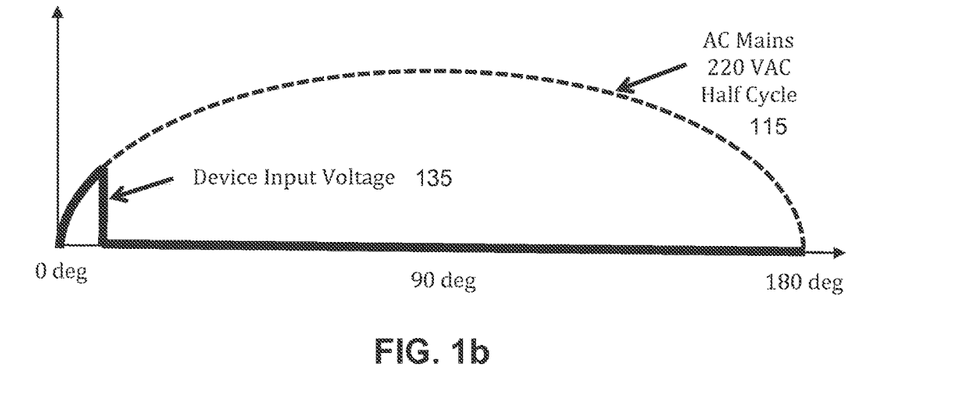
FIG. 1b illustrates an input voltage signal of a device according to one embodiment.

FIG. 1b illustrates a device input voltage signal 135 of a device 106 according to one embodiment. The dimmer switch 104 adjusts the V-RMS of lamp input voltage by controlling the phase angle of the AC input voltage signal 115. In particular, the dimmer switch 104 reduces the V-RMS of device input voltage signal 135 by eliminating a portion of each half-cycle of the AC input voltage signal 115. Generally, the dimmer switch 104 increases the dimming effect (i.e., lowers the light intensity) by increasing the portion of each half-cycle that is eliminated and thereby decreasing the dimmer on-time. In one embodiment, the dimmer switch 104 employs a triac device to generate phase angle switching to adjust the lamp (device) input voltage signal 135. Once triggered, the triac device continues to conduct current to the LED lamp 106 until the current falls below a threshold (referred to as a holding current). As shown in the example illustrated in FIG. 1b, the device input voltage signal 135 only matches the AC mains input voltage signal 115 for a small portion of the signal.

Figure 1C:
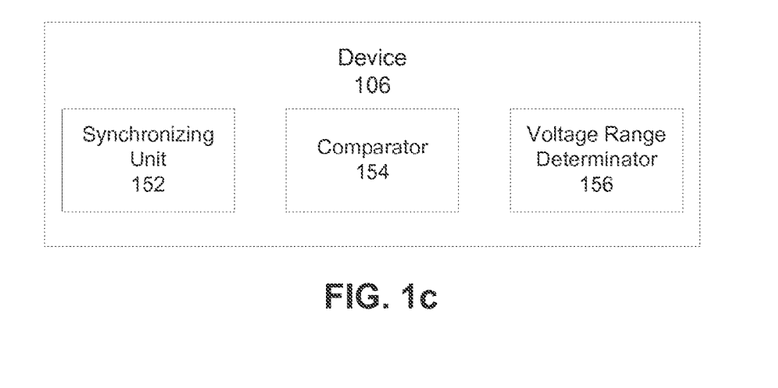
FIG. 1c illustrates additional details of the device according to one embodiment.

FIG. 1c illustrates additional details of the device 106 according to one embodiment. The device 106 can include a variety of components in hardware, software, firmware, for example to performing particular steps. In this embodiment, the device includes a synchronizing unit 152 for synchronizing the device input voltage signal 135 and a reference signal. The device unit can also include a comparator 154 for comparing the device input voltage signal 135 and a reference signal. The device 106 can include a voltage range determinator 156 to assist in determining the voltage range of the voltage source 102. In some embodiments one or more of these units can be external to the device 106.

Figure 2A:
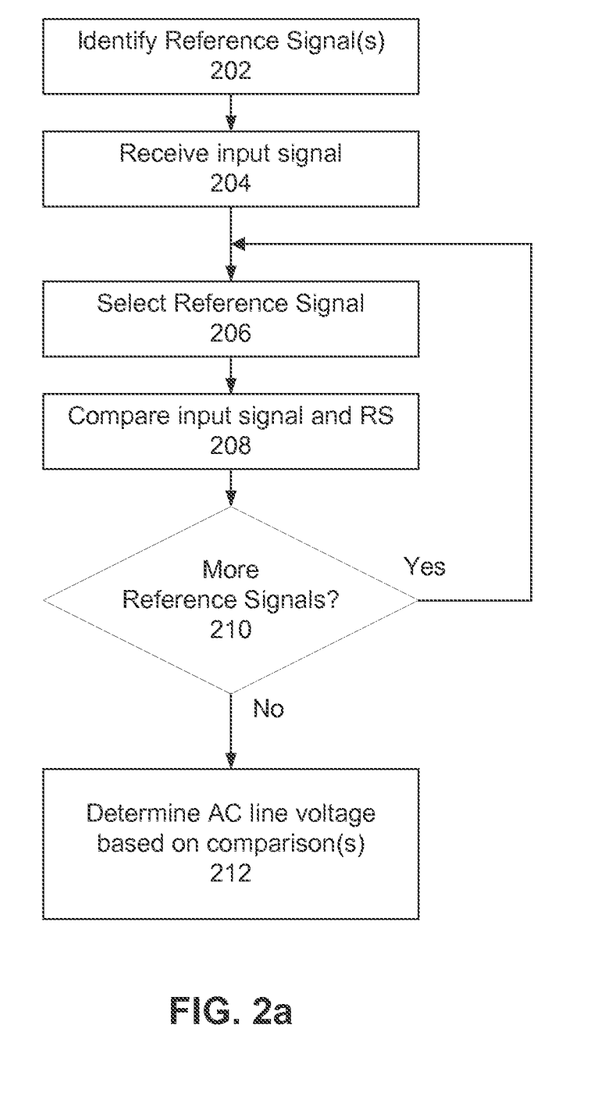
FIG. 2a is a flow chart of a method of determining the AC mains voltage signal range in accordance with one embodiment.

FIG. 2a is a flow chart of a method of determining the AC mains voltage signal range in accordance with one embodiment. In this embodiment the device 106 identifies one or more reference signals. In alternate embodiments, the reference signal(s) can be generated external to and/or within the device 106. The reference signal(s) 235/335 (FIG. 2c/FIG. 3) can be a signal, a look-up table of signal values or other manner of identifying values that can be compared to the AC mains (input) signal 115. The device 106 receives 204 the device input voltage signal 135. The device then ensures that reference signal(s) is (are) time synchronized with the device input voltage signal 135, i.e., the signals have identical frequency and phase. This can be accomplished using any of a variety of conventional techniques. Ensuring that the phases are substantially aligned enables the embodiments to properly compare the signals in step 208.

In an embodiment an iterative process is used to compare each reference signal to the device input voltage signal 135. In alternate embodiments the comparisons can be done in parallel or in some combination thereof. For ease of discussion an iterative process is described herein. The device selects 206 a reference signal and compares 208 the selected reference signal to the device input voltage signal 135. In particular the device 206 compares the portion of the device input voltage signal 135 that was not cut by the phase-cut dimmer switch 104. If 210 there are additional reference signals that should be compared the process repeats starting from step 210. In some embodiments, additional reference signals are not chosen if a particular criteria has been met. For example, in an embodiment where there are multiple reference signals, once the device 106 identifies two adjacent reference signals between which the device input voltage signal 135 lies, then no additional reference signals need to be compared. In this example, adjacent reference signals are reference signals having values such that no other reference signal is between them. When 210 a criteria is met and/or there are no more reference signals then the device 106 determines 212 the AC input voltage 115 based upon the comparisons.

Figure 2B:
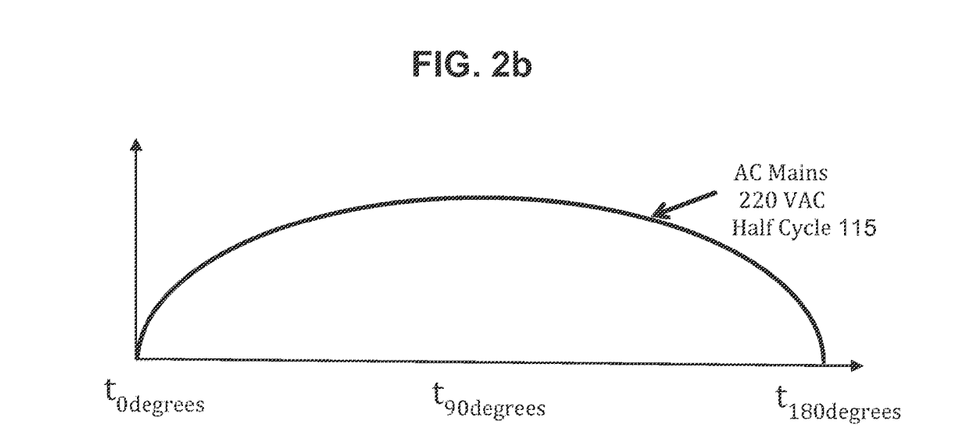
FIG. 2b illustrates a voltage signal from an AC mains according to one embodiment.
Figure 2C:
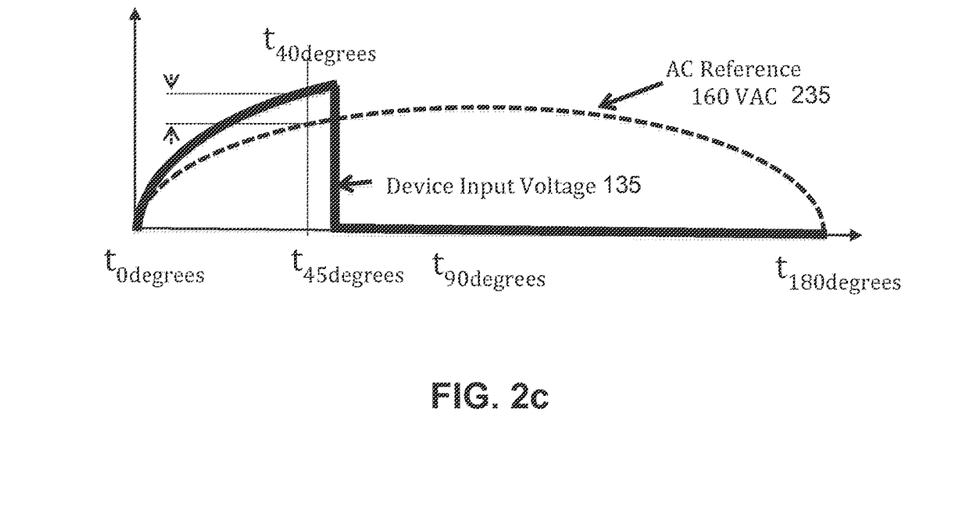
FIG. 2c illustrates an input signal of a device according to one embodiment.

FIG. 2b illustrates a half cycle of a AC input voltage signal 115 from an AC mains according to one embodiment. FIG. 2c illustrates a device input voltage signal 135 of device 106 according to one embodiment. In the example illustrated by FIGS. 2b and 2c, the phase-cut dimmer switch (or other type of dimmer switch) 104 blocks the AC mains input voltage signal 115 from the device from approximately 45 degrees to 180 degrees. In this example, the AC mains are either 120 volts or 220 volts. A 120 AC VAC has a range of approximately 85 VAC to 135 VAC (referred to herein when describing some embodiments as the LOW-range), and (b) 220 VAC has a range of approximately 170 VAC to 270 VAC (referred to herein when describing some embodiments as the HIGH-range). In this example, the reference signal 235 is selected to be a signal between the highest value of LOW-range, i.e., 135 VAC, and the lowest value of the HIGH-range, i.e., 170 VAC. In this example the reference voltage is identified as 160 VAC, although other values could be used. The device compares the device input voltage signal 135 with the reference signal at one or more phases that were not blocked/cut by the phase-cut dimmer switch 104. In this example, the comparison is done at one or more phases between one degree and 45 degrees. In order to reduce the effects of noise for example, a phase is chosen in this example such that the difference between the device input voltage signal 135 and the reference signal 235 is near a maximum. In this example, a phase of 40 degrees is chosen as the comparison point. If the device input voltage signal 135 exceeds the reference signal 235 at time $t_{40degrees}$ then the device determines 212 that the AC line voltage is at 220 VAC. If the device input voltage signal 135 is lower than the reference signal 235 at this phase then the device determines 212 that the AC line voltage is at 120 VAC.

In an embodiment, a reference is provided, having the following characteristics; (1) it represents an AC signal below the lowest value of the HIGH-range and above the highest value of the LOW-range, and (2) is time synchronized with the AC mains signal, having identical frequency and phase. In the above example, the AC reference is set to 160 VAC. The AC mains voltage range is determined by comparing a portion of the AC mains signal that is input (not blocked by the dimmer switch) to the device with the AC reference. For example, the input voltage to the device at $t_{40degrees}$ is greater than the AC reference, and it can be determined that the AC mains is set to HIGH-range.

The detection can be made during any AC cycle where a portion of the AC mains signal is available to the device, including at start up, or at any time during operation. Once the AC mains voltage, or voltage range (HIGH range or LOW range) is determined, the device can use the information to adjust operating parameters to optimize performance, e.g. control parameters to enhance operating efficiency, protection modes and thresholds.

Any available portion of the AC mains input voltage signal 115 can be used, including portions where the AC mains voltage is decreasing. This allows for AC mains sensing regardless if the device is connected to the AC mains 102 via a leading-edge and/or trailing edge phase cut dimmer switch 104.

Figure 3:
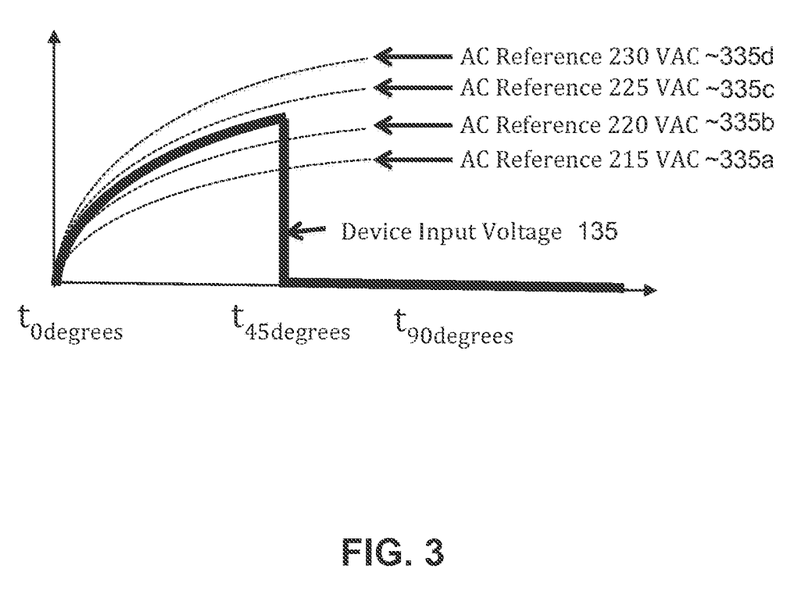
FIG. 3 illustrates an input signal of a device and four reference signals according to one embodiment.

In embodiments, a more precise determination of the AC mains operating voltage can occur using multiple reference voltages 225, 335. FIG. 3 illustrates an input signal of a device and four reference signals 335 according to one embodiment. The reference voltages 335 are identified 202 and the device receives the device input voltage signal 135. The device selects 206 a reference signal, e.g., AC reference signal 215 VAC 335a, and compares 208 the device input voltage signal 135 with the reference signal 335a and determines that the device input voltage signal 135 exceeds the reference signal 335a. Other reference signals are available 210 and another reference signal 335b is selected 206, e.g., AC reference signal 220 VAC 335b. The device compares 208 the device input voltage signal 135 with the reference signal 335b and determines that the device input voltage signal 135 exceeds the reference signal 335b. Other reference signals are available 210 and another reference signal 335c is selected 206, e.g., AC reference signal 225 VAC 335c. The device compares 208 the device input voltage signal 135 with the reference signal 335c and determines that the device input voltage signal 135 exceeds the reference signal 335c. The device 106 determines 212 that the AC mains line voltage is between 220 VAC and 225 VAC in this example.

Figure 4:
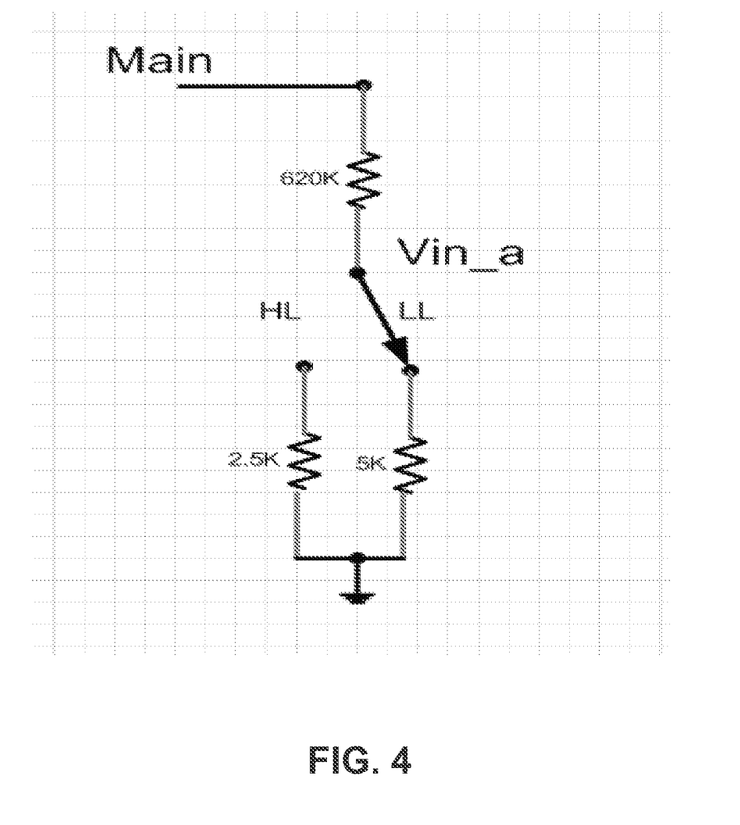
FIG. 4 illustrates an example of how the device is adjusted in response to identifying the AC mains voltage according to one embodiment.

FIG. 4 illustrates an example of how the device is adjusted in response to identifying the AC mains voltage according to one embodiment. In this example, if the AC mains voltage is determined to be in the HIGH-range, corresponding to 220 VAC, then a circuit in the device 106 in some embodiments can be modified to connect the switch to a vin sense resistor to 2.5 kΩ resistor. Similarly, if the AC mains voltage is determined to be in the LOW-range, corresponding to 120 VAC, then a circuit in the device 106 in some embodiments can be modified to connect the switch to a vin sense resistor to 5.0 kΩ resistor.

Additional compensations can occur on the device once the mains AC voltage is determined. Examples include modifying RC snubbler parameters, input capacitor sizes, other protective components, e.g., an inrush limit resistor, etc.

Reference in the specification to "one embodiment" or to "an embodiment" means that a particular feature, structure, or characteristic described in connection with the embodiments is included in at least one embodiment. The appearances of the phrase "in one embodiment" or "an embodiment" in various places in the specification are not necessarily all referring to the same embodiment.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps (instructions) leading to a desired result. The steps are those requiring physical manipulations of physical quantities. Usually, though not necessarily, these quantities take the form of electrical, magnetic or optical signals capable of being stored, transferred, combined, compared and otherwise manipulated. It is convenient at times, principally for reasons of common usage, to refer to these signals as bits, values, elements, symbols, characters, terms, numbers, or the like. Furthermore, it is also convenient at times, to refer to certain arrangements of steps requiring physical manipulations or transformation of physical quantities or representations of physical quantities as modules or code devices, without loss of generality.

However, all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or "determining" or the like, refer to the action and processes of a computer system, or similar electronic computing device (such as a specific computing machine), that manipulates and transforms data represented as physical (electronic) quantities within the computer system memories or registers or other such information storage, transmission or display devices.

Certain aspects of the embodiments include process steps and instructions described herein in the form of an algorithm. It should be noted that the process steps and instructions of the embodiments can be embodied in software, firmware or hardware, and when embodied in software, could be downloaded to reside on and be operated from different platforms used by a variety of operating systems.

The embodiments can also be in a computer program product which can be executed on a computing system.

The embodiments also relate to an apparatus for performing the operations herein. This apparatus may be specially constructed for the purposes, e.g., a specific computer, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, magnetic-optical disks, read-only memories (ROMs), random access memories (RAMs), EPROMs, EEPROMs, magnetic or optical cards, application specific integrated circuits (ASICs), or any type of media suitable for storing electronic instructions, and each coupled to a computer system bus. Memory can include any of the above and/or other devices that can store information/data/programs and can be transient or non-transient medium, where a non-transient or non-transitory medium can include memory/storage that stores information for more than a minimal duration. Furthermore, the computers referred to in the specification may include a single processor or may be architectures employing multiple processor designs for increased computing capability.

The algorithms and displays presented herein are not inherently related to any particular computer or other apparatus. Various general-purpose systems may also be used with programs in accordance with the teachings herein, or it may prove convenient to construct more specialized apparatus to perform the method steps. The structure for a variety of these systems will appear from the description herein. In addition, the embodiments are not described with reference to any particular programming language. It will be appreciated that a variety of programming languages may be used to implement the teachings of the embodiments as described herein, and any references herein to specific languages are provided for disclosure of enablement and best mode.

In addition, the language used in the specification has been principally selected for readability and instructional purposes, and may not have been selected to delineate or circumscribe the inventive subject matter. Accordingly, the disclosure of the embodiments is intended to be illustrative, but not limiting, of the scope of the embodiments, which is set forth in the claims.

While particular embodiments and applications have been illustrated and described herein, it is to be understood that the embodiments are not limited to the precise construction and components disclosed herein and that various modifications, changes, and variations may be made in the arrangement, operation, and details of the methods and apparatuses of the embodiments without departing from the spirit and scope of the embodiments as defined in the appended claims.

What is claimed is:

1. A method for determining a voltage range of a voltage source, the voltage source generating sinusoidal signals, comprising:
   receiving an input signal input to a device, the input signal having a first portion that is a sinusoidal signal that generally corresponds to a first portion of the voltage source signal, the input signal having a second portion that is not a sinusoidal signal that generally corresponds to a second portion of the voltage source signal;
   receiving from the device, a selected sinusoidal reference signal, wherein the selected sinusoidal reference signal is synchronized with the input signal;
   comparing voltage values of the first portion of the input signal at a plurality of phases with voltage values of a corresponding portion of the selected sinusoidal reference signal at the plurality of phases, wherein before comparing the voltage values a phase of the plurality of phases is chosen based on an estimated difference between a voltage value of the first portion of the input signal at the phase and a voltage value of the corresponding portion of the selected sinusoidal reference signal at the same phase; and
   determining the voltage range of the voltage source based on the comparison.

2. The method of claim 1, wherein the input signal corresponds to the voltage source signal that is partially blocked at a same range of phases across multiple consecutive cycles of the voltage source signal.

3. The method of claim 1, further comprising synchronizing the selected sinusoidal reference signal with the input signal.

4. The method of claim 1, wherein receiving the selected sinusoidal reference signal further comprises:
   receiving a first sinusoidal reference signal wherein the first sinusoidal reference signal is synchronized with the input signal;
   receiving a second sinusoidal reference signal wherein the second sinusoidal reference signal is synchronized with the input signal; and
   selecting one of the first and second sinusoidal reference signals as the selected reference signal.

5. The method of claim 4, further comprising:
   selecting the first sinusoidal reference signal as the selected sinusoidal reference signal if the first reference signal has not previously been selected; and
   selecting the second sinusoidal reference signal as the selected sinusoidal reference signal if the second sinusoidal reference signal has not previously been selected.

6. The method of claim 1, wherein the voltage source is an alternating current (AC) mains voltage source.

7. The method of claim 6, wherein the determined voltage range is one of approximately 120 volts, approximately 220 volts, approximately 230 volts, or approximately 240 volts.

8. The method of claim 6, wherein the determined voltage range is one of approximately 120 volts or approximately 220 volts.

9. The method of claim 1, wherein the device is a light-emitting diode (LED) device.

10. A device for determining a voltage range of a voltage source, the voltage source generating sinusoidal signals, comprising:
   an input for receiving an input signal, the input signal having a first portion that is a sinusoidal signal that generally corresponds to a first portion of the voltage source signal, the input signal having a second portion that is not a sinusoidal signal that generally corresponds to a second portion of the voltage source signal;
   a reference receiver, for receiving a selected sinusoidal reference signal from the device, wherein the selected sinusoidal reference signal is synchronized with the input signal;
   a comparator for comparing voltage values of the first portion of the input signal at a plurality of phases with voltage values of a corresponding portion of the selected sinusoidal reference signal at the plurality of phases, wherein before comparing the voltage values a phase of the plurality of phases is chosen based on an estimated difference between a voltage value of the first portion of the input signal at the phase and a voltage value of the corresponding portion of the selected sinusoidal reference signal at the same phase; and a voltage range determinator for determining the voltage range of the voltage source based on the comparison.

11. The device of claim 10, wherein the input signal corresponds to the voltage source signal that is partially blocked at a same range of phases across multiple consecutive cycles of the voltage source signal.

12. The device of claim 10, further comprising a synchronizing unit for synchronizing the selected sinusoidal reference signal with the input signal.

13. The device of claim 10, wherein the reference receiver:

receives a first sinusoidal reference signal wherein the first sinusoidal reference signal is synchronized with the input signal;

receives a second sinusoidal reference signal wherein the second sinusoidal reference signal is synchronized with the input signal; and selects one of the first and second sinusoidal reference signals as the selected sinusoidal reference signal.

14. The device of claim 13, further comprising:

a reference selector for selecting the first sinusoidal reference signal as the selected sinusoidal reference signal if the first sinusoidal reference signal has not previously been selected; and selecting the second sinusoidal reference signal as the selected sinusoidal reference signal if the second sinusoidal reference signal has not previously been selected.

15. The device of claim 10, wherein the voltage source is an alternating current (AC) mains voltage source.

16. The device of claim 15, wherein the determined voltage range is one of approximately 120 volts, approximately 220 volts, approximately 230 volts, or approximately 240 volts.

17. The device of claim 15, wherein the determined voltage range is one of approximately 120 volts or approximately 220 volts.

18. The device of claim 10, wherein the input signal is received directly or indirectly from a dimmer switch.

19. The device of claim 18, wherein the dimmer switch is a phase-cut dimmer switch.

20. The device of claim 10, wherein the device is a light-emitting diode (LED) device.

* * * * *